United States Patent [19]

Wakai

[11] Patent Number: 5,424,230
[45] Date of Patent: Jun. 13, 1995

[54] METHOD OF MANUFACTURING A POLYSILICON THIN FILM TRANSISTOR

[75] Inventor: Haruo Wakai, Hamura, Japan

[73] Assignee: Casio Computer Co., Ltd., Tokyo, Japan

[21] Appl. No.: 283,250

[22] Filed: Jul. 29, 1994

Related U.S. Application Data

[63] Continuation-in-part of Ser. No. 9,554, Jan. 26, 1993.

[30] Foreign Application Priority Data

Feb. 19, 1992 [JP] Japan ................................. 4-069868
Feb. 19, 1992 [JP] Japan ................................. 4-069869

[51] Int. Cl.⁶ ........................................... H01L 21/786
[52] U.S. Cl. ..................................... 437/40; 437/247;
437/913; 437/937; 148/DIG. 1; 148/DIG. 90;
148/DIG. 150
[58] Field of Search ................. 437/40, 247, 913, 101;
148/DIG. 150, DIG. 3, DIG. 90, DIG.91,
DIG. 92, DIG. 93, DIG. 1

[56] References Cited

U.S. PATENT DOCUMENTS

| | | |
|---|---|---|
| 4,766,477 | 8/1988 | Zakagawa et al. |
| 5,064,775 | 11/1991 | Chang ....................... 148/DIG. 150 |
| 5,075,237 | 12/1991 | Wu ................................. 148/DIG. 1 |
| 5,102,813 | 4/1992 | Kobayashi et al. ........... 148/DIG. 1 |
| 5,171,710 | 12/1992 | Yamazaki et al. .................... 437/247 |
| 5,210,050 | 5/1993 | Yamazaki et al. ............. 148/DIG. 1 |
| 5,236,850 | 8/1993 | Zhang ............................ 148/DIG. 1 |
| 5,313,075 | 5/1994 | Zhang et al. ............................ 257/57 |

FOREIGN PATENT DOCUMENTS

| | | | |
|---|---|---|---|
| 0485233 | 5/1992 | European Pat. Off. .............. 437/40 |
| 1187814 | 7/1989 | Japan ......................... 148/DIG. 90 |
| 3219643 | 9/1991 | Japan .................................. 437/225 |

OTHER PUBLICATIONS

Wolf et al; "Silicon Processing for the VLSI Era"; vol. 1, pp. 169-172, 1986.
Sameshima et al "Xecla Excimer Laser Annealing Used in the Fabrication of Poly-Su TfT's", IEEE Electron Device Letter 7(5), May 1986.

Primary Examiner—Brian E. Hearn
Assistant Examiner—Michael Trinh
Attorney, Agent, or Firm—Frishauf, Holtz, Goodman & Woodward

[57] ABSTRACT

An amorphous silicon hydride thin film is deposited on an insulating body by a plasma CVD method, and is then heated for dehydrogenating the amorphous silicon thin film so that a dehydrogenated amorphous silicon thin film containing hydrogen of 3 atomic % or less is formed. The insulating body may be an insulating substrate (such as a glass substrate) alone, or a combination of an insulating substrate with an intermediate insulating base layer thereon. Impurity ions are injected into the dehydrogenated amorphous silicon hydride thin film to form source and drain regions. Excimer laser beams are applied to the dehydrogenated amorphous silicon thin film, thereby polycrystallizing the amorphous silicon thin film into a polysilicon thin film and activating the injected impurity ions.

20 Claims, 4 Drawing Sheets

METHOD OF MANUFACTURING A POLYSILICON THIN FILM TRANSISTOR

This application is a Continuation-In-Part, of application Ser. No. 08/009,554, filed Jan. 26, 1993.

BACKGROUND OF THE INVENTION

1. Field of the Invention

The present invention relates to a method of manufacturing a polysilicon thin-film transistor of a high electron mobility type.

2. Description of the Related Art

Research in active matrix liquid crystal displays (LCDs) has been developed. In an active matrix LCD, thin-film transistors are formed on a glass substrate. The thin-film transistor is used as a switching element for charging a pixel electrode to apply an electric field to a liquid crystal. Generally, the LCD is constituted by an amorphous silicon TFT (thin-film transistor), which is typically deposited on the glass substrate by a plasma CVD method.

In recent years, it has been considered to deposit on the glass substrate, polysilicon which has an electron mobility which is more than ten times greater than that of amorphous silicon. If the electron mobility of a thin-film transistor is increased, it is possible to construct a circuit for driving an LCD, a RAM, a ROM, and a CPU by using the thin-film transistor. This allows a large scale semiconductor device which cannot be formed by a semiconductor wafer.

There are two methods to deposit a polysilicon TFT on a glass substrate: one is to directly deposit polysilicon on a glass substrate; and the other is to deposit amorphous silicon on a glass substrate and thereafter anneal the amorphous silicon to form polysilicon. The former method is advantageous in efficiency, but disadvantageous in cost since the substrate must be formed of an expensive material which is resistant to a high temperature. In addition, the electron mobility cannot be satisfactorily increased. Although a low-temperature process has been developed, no remarkable effect has been published at present.

The present invention relates to the latter method. When amorphous silicon is deposited on a glass substrate by use of a conventional plasma CVD method, a substrate formed of an inexpensive material can be used, since the substrate is heated to a relatively low temperature. However, the method has the following drawback: amorphous silicon formed by use of the plasma CVD method includes hydrogen, which bursts away when amorphous silicon is polycrystallized into polysilicon by an annealing or heating process, resulting in a physical defect. To overcome this drawback, a method of depositing amorphous silicon by use of a low-pressure CVD method has been considered. Since amorphous silicon formed by the low-pressure CVD method includes little hydrogen, the burst of hydrogen in an annealing or heating process as in the plasma CVD method does not occur. However, since the substrate must be heated at a relatively high temperature, i.e., 500° to 600° C., it must be formed of an expensive glass substrate resistant to heat. Moreover, the conventional annealing or heating, which is achieved by CW (continuous wave) laser irradiation, produces polysilicon having inferior characteristics and a low electron mobility, i.e., about 10 $cm^2$/v.sec, since the polycrystallization by the CW laser irradiation is solid-phase growth.

SUMMARY OF THE INVENTION

It is accordingly an object of the present invention to provide a method of manufacturing thin-film transistor by which amorphous silicon can be deposited on the substrate (or an insulating body) at a relatively low temperature, and wherein a polysilicon thin film having a satisfactorily high electron mobility can be obtained.

According to the present invention, there is provided a method of manufacturing a thin-film transistor comprising the steps of:

providing an insulating body;

depositing an amorphous silicon hydride thin film on the insulating body by a plasma CVD method;

heating the amorphous silicon hydride thin film to dehydrogenate the amorphous silicon hydride thin film, thereby forming a dehydrogenated amorphous silicon thin film; and applying excimer laser beams to the dehydrogenated amorphous silicon thin film, thereby polycrystallizing the dehydrogenated amorphous silicon thin film into a polysilicon thin film.

The "insulating body" referred to above includes both cases: (i) the combination of an insulating substrate and an insulating base layer formed on the substrate, and (ii) only an insulating substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

FIGS. 1 to 7 show steps of manufacturing a plurality of thin-film transistors according to a first embodiment of the present invention. The method of manufacturing the thin-film transistor will now be described with reference to FIGS. 1 to 7.

Figure 1:
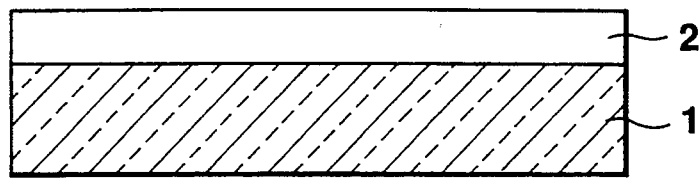
FIGS. 1 to 7 are enlarged cross-sectional views showing the steps of manufacturing a thin-film transistor of the present invention.

First, as shown in FIG. 1, an amorphous silicon hydride thin film 2 is deposited on the upper surface of a transparent insulating body such as an insulating substrate 1 made of glass or the like by a plasma CVD method by using a mixed gas containing $SiH_4$ and $H_2$. In this step, the insulating substrate (body) 1 is set at a temperature of 200° to 350° C., preferably, 250° C. The mixed gas contains $SiH_4$ of 10 to 20 SCC (standard cubic centimeter) and H$_2$ of an amount about ten times as that of SiH$_4$. The thickness of the amorphous silicon hydride thin film 2 is formed to have a thickness of 400 to 1000 Å, preferably about 500 Å. Under these conditions, the hydrogen content of the amorphous silicon hydride thin film 2 is about 10 to 20 atomic %. Then, in order to prevent a hydrogen burst in a succeeding step wherein high energy is given by excimer laser irradiation, dehydrogenation is performed to change each of the amorphous silicon hydride thin films 2 into an amorphous silicon thin film 3. In this dehydrogenating step, the insulating substrate 1 on which the amorphous silicon hydride thin film 2 is deposited is heated at a temperature of about 450° C. for about 1 hour in an N$_2$ atmosphere, thereby reducing the hydrogen content of the amorphous silicon hydride thin film 2 to 3 atomic % or less, and preferably, 1 atomic % or less. Thus, since the amorphous silicon hydride thin film 2 is deposited on the upper surface of the insulating substrate 1 by use of a plasma CVD method, the temperature of the insulating substrate 1 can be 350° C. or lower (450° C. or lower in the heat treatment). As a result, a substrate of an inexpensive material can be used and the time required to heat the substrate can be reduced. Moreover, it is possible to dehydrogenate several tens to several hundreds of insulating substrates 1 simultaneously. Therefore, although a dehydrogenating step is required, the manufacturing time as a whole is shorter than that in the conventional method.

Figure 2:
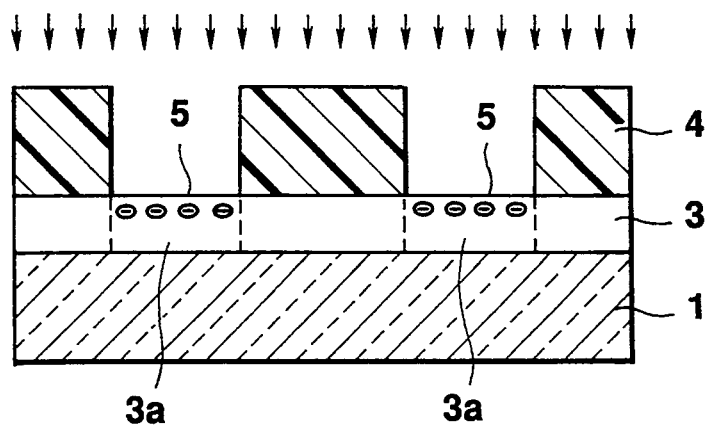

Next, as shown in FIG. 2, a photoresist film 4 is patterned on the upper surface of the amorphous silicon thin film 3 obtained by the dehydrogenating step, except at the regions of the film 3 which correspond to source and drain forming regions 3a. Using the photoresist film 4 as a mask, impurities such as phosphor ions are injected into the source and drain forming regions 3a of the amorphous silicon thin film 3, to form impurity-injected regions 5. Thereafter, the photoresist film 4 is removed.

Figure 3:
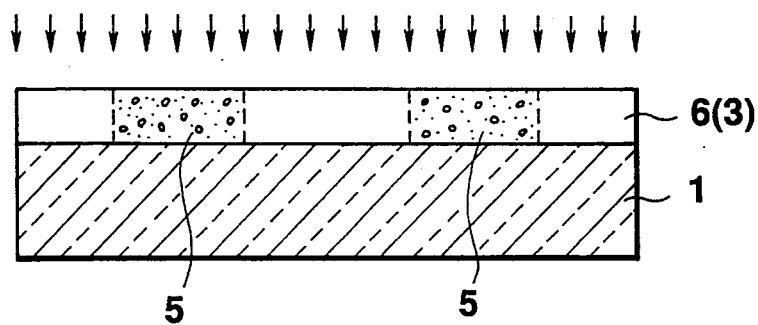

Subsequently, as shown in FIG. 3, XeCl excimer laser beams having a wavelength of 308 nm are applied to the amorphous silicon film under the conditions of an energy density of about 250 to 350 mJ/cm$^2$ and a pulse width of about 50 nsec. As a result, the amorphous silicon thin film 3 is polycrystallized into a polysilicon thin film 6 and phosphor ions in each of impurity-injected regions 5 are activated. In this step, since the polycrystallization of the amorphous silicon thin film 3 and the activation of ions in the impurity-injected region 5 are simultaneously achieved by an excimer laser irradiation, the number of the manufacturing steps can be reduced as compared to the method in which the polycrystallization and the activation are performed in different steps. In addition, since the polycrystallization by excimer laser beams is liquid-phase growth, crystals of the polysilicon thin film 6 are large and uniform in size and the electron mobility is high. The above XeCl excimer laser beams may be replaced by KrF excimer laser beams having a wavelength of 248 nm, ArF excimer laser beams having a wavelength of 193 nm, ArCl excimer laser beams having a wavelength of 175 nm, or XeF excimer laser beams having a wavelength of 353 nm.

Figure 4:
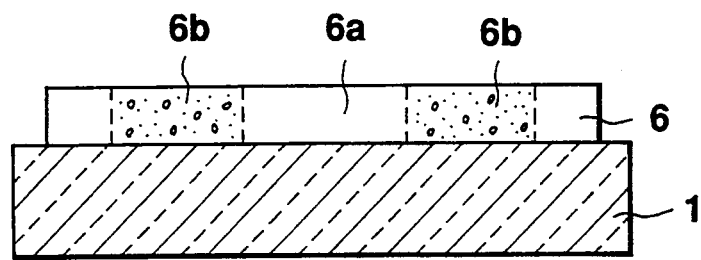
Figure 5:
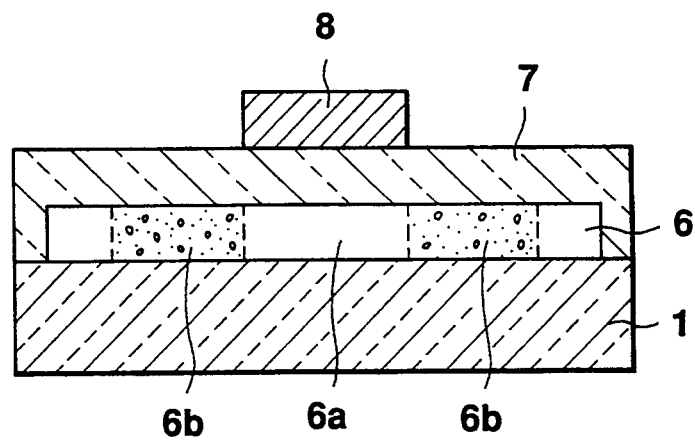

Next, as shown in FIG. 4, unneeded portions of the polysilicon thin film 6 are removed by an etching technique. In the state shown in FIG. 4, the central portion of the polysilicon thin film 6 serves as a channel region 6a, and side portions thereof as source and drain regions 6b. Thereafter, as shown in FIG. 5, a gate-insulating film 7 made of a silicon oxide film and a silicon nitride film is formed on the entire surface of the substrate 1 and film 6. More specifically, a silicon oxide film is formed on the substrate 1 and the film 6 by use of a sputtering method, and subsequently, a silicon nitride film is deposited on the silicon oxide film by use of a plasma CVD method using a mixed gas containing SiH$_4$, NH$_3$, and N$_2$. When a silicon nitride film is formed by the plasma CVD method provided the insulating substrate is processed with a mixed gas containing SiH$_4$ of about 30 SCCM, NH$_3$ of about 60 SCCM, and N$_2$ of about 390 SCCM under the conditions of a substrate temperature of about 250° C., an output of about 600 W, and a pressure of about 0.5 Torr, the polysilicon thin film 6 is hydrogenated at the same time, thereby reducing the dangling bonds. In other words, if the polysilicon thin film 6 is subjected to plasma CVD using the above-mentioned mixed gas under the above-mentioned conditions, the polysilicon thin film 6 is hydrogenated and the dangling bonds therein are reduced at the same time as the gate-insulating film 7 is deposited. Thus, the deposition of the gate-insulating film 7 and the hydrogenation of the polysilicon thin film 6 are simultaneously achieved by one plasma CVD process. Thus, since no additional hydrogenating step is required, the number of the manufacturing steps is reduced. Then, a gate electrode 8 formed of Cr or the like is formed by a photolithography technique on that portion of the gate-insulating film 7 which corresponds to the channel region 6a.

Figure 6:
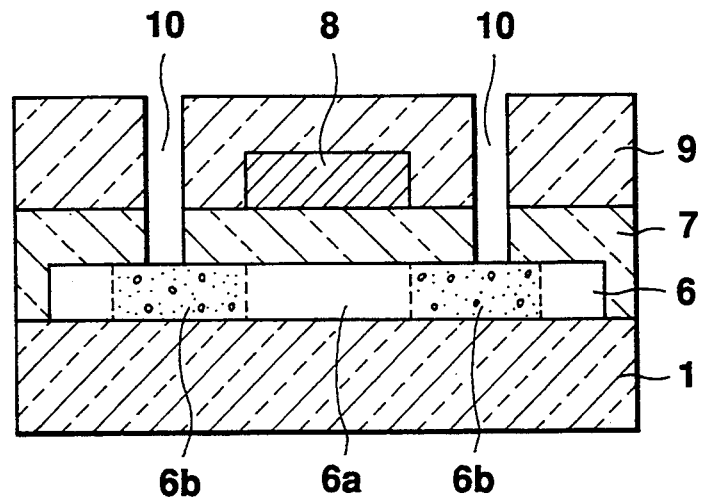
Figure 7:
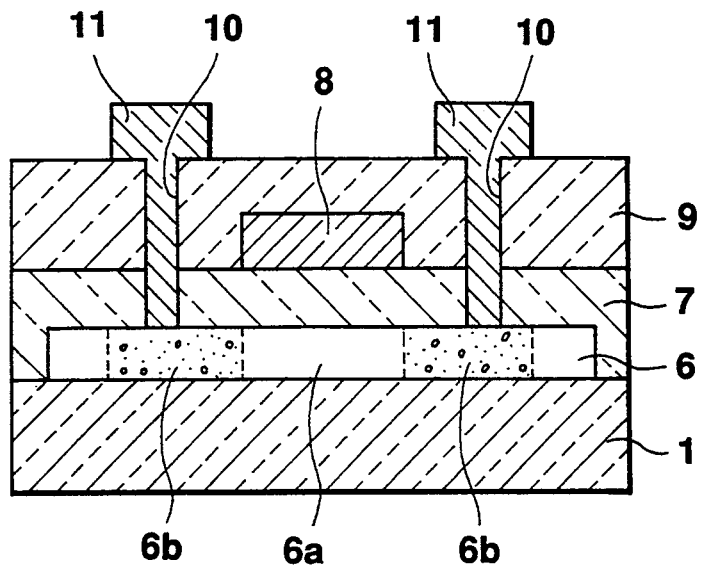

Thereafter, as shown in FIG. 6, an interlayer insulating film 9 made of silicon nitride or the like is formed on the entire surfaces of members 7, 8. Then, contact holes 10 are formed in those portions of the interlayer insulating film 9 and the gate-insulating film 7 which correspond to the source and drain regions 6b. Subsequently, as shown in FIG. 7, source and drain electrodes 11 made of Al are patterned on the interlayer insulating film 9 and connected to the source and drain regions 6b through the contact holes 10. The field effect thin-film transistor thus obtained has an electron mobility of 80 m$^2$/V.sec or greater, and the crystals of the polysilicon thin film 6 are satisfactorily large and uniform.

When a polysilicon thin film 6 is directly formed on an insulating substrate 1, as in the above-described embodiment, there will be no problem if the insulating substrate 1 is made of quartz glass. However, since quartz glass is expensive, an inexpensive material such as borosilicate glass may be used as the material of the insulating substrate 1, in which case, impurities contained in the glass will be disadvantageously transferred to the polysilicon thin film 6 formed in direct contact with the substrate 1, resulting in drawbacks such as degradation of the characteristics of the semiconductor and an inferior condition of the interface between the borosilicate glass substrate and the polysilicon thin film 6. To overcome these drawbacks, the present invention of FIG. 9 comprises an intermediate insulating base layer 1a interposed between the substrate 1 and the polysilicon thin film 6. The combination of the substrate 1 and the base layer 1a thereon comprises an insulating body on one side of which the thin film 6 is formed. That is, the intermediate base layer 1a is formed on the substrate 1 for the purpose of improving the condition of the interface between the glass substrate 1 and the polysilicon thin film 6, and for preventing the impurities from transferring from the glass substrate 1 to the polysilicon thin film. The intermediate base layer 1a is preferably made of silicon oxide, silicon nitride or a laminated structure of silicon oxide and silicon nitride.

Figure 9:
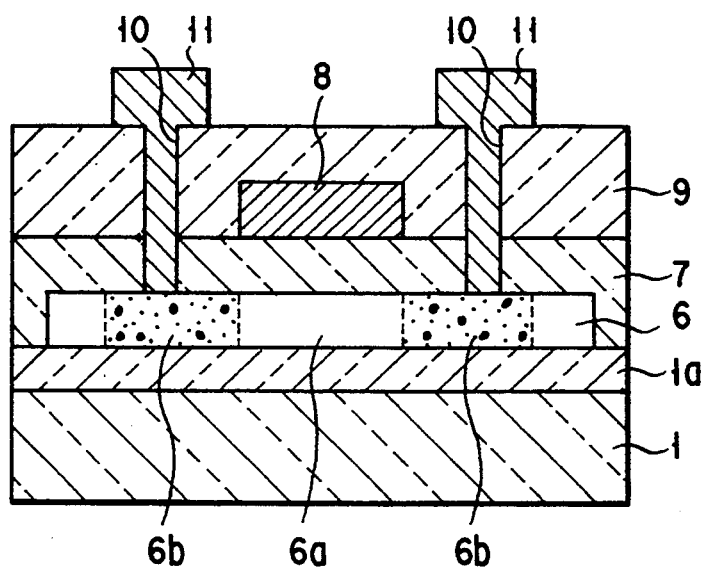
FIG. 9 is an enlarged cross-sectional view of the embodiment shown in FIG. 7, but showing the use of an intermediate insulating base layer on the insulating substrate.

In the modified method of manufacturing a thin-film transistor using this intermediate base layer 1a according to the present invention of FIG. 9, the intermediate base layer 1a is formed on the insulating substrate 1 by a plasma CVD method or the like, and then an amorphous silicon hydride thin film 2 is deposited on the intermediate base layer 1a as described above with reference to FIG. 1. Subsequent manufacturing steps are the same as described above with reference to FIGS. 2–7.

In the embodiment of FIG. 9, the combination of the insulating substrate 1 and the intermediate base layer 1a thereon comprises an "insulating body", as referred to above in connection with FIG. 1.

Figure 8:
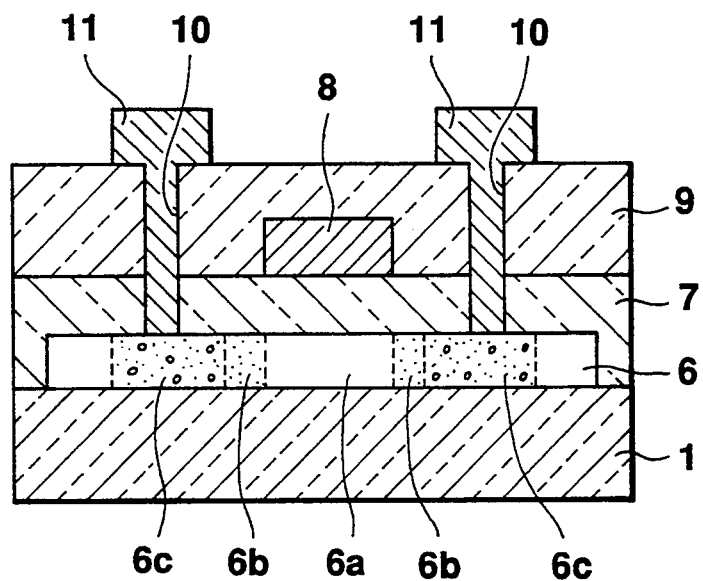
FIG. 8 is an enlarged cross-sectional view showing another type of thin-film transistor manufactured by use of the method of the present invention.

In the above embodiment, the present invention is applied to a thin-film transistor of a normal MOS type. However, it may be applied to a thin-film transistor of an LDD (lightly doped drain) type, which has a higher withstand voltage and which is accordingly more reliable than the MOS type thin-film transistor. FIG. 8 shows an LDD type thin-film transistor according to a further embodiment of the present invention. The LDD type thin-film transistor comprises a channel region 6a at the central portion of a polysilicon thin film 6, source and drain regions 6c of a higher impurity concentration or level formed on both sides of the channel region 6a, and source and drain regions 6b of a lower impurity concentration or level formed between the channel region 6a and the other source and drain regions 6c.

A method of forming the LDD type thin-film transistor will now be described. First, in a state as shown in FIG. 2, those portions of the photoresist film 4 which are to form the source and drain regions 6b of the lower impurity concentration and the source and drain regions 6c of the higher impurity concentration are removed. In this state, impurities are injected into the amorphous silicon thin film 3 to a low impurity concentration. Thereafter, the photoresist film 4 is entirely removed. Then, a new photoresist film (not shown) is formed on the amorphous silicon thin film 3. Holes are formed in the photoresist film to form source and drain regions 6c of a higher impurity concentration in the amorphous silicon thin film 3. Then, impurities of a high concentration are injected through the holes to those portions of the amorphous silicon thin film 3 which correspond to the source and drain region 6c. The subsequent steps are the same as those in the first embodiment, and descriptions thereof are omitted. In FIG. 8, the same elements as in the first embodiment are identified with the same reference numerals.

The intermediate insulating base layer 1a, described above with reference to FIG. 9, can be used in the embodiment of FIG. 8, as should be apparent. The resulting structure would have the intermediate base layer 1a interposed between the substrate 1 and the regions 6, 6a and 6b, as shown in FIG. 9.

In the above embodiments, the present invention is applied to a coplanar thin-film transistor of a top gate type. However, it may be applied to a coplanar thin-film transistor of a back gate type or a stagger thin-film transistor. In a case of a back gate type, a gate electrode and a gate-insulating film are formed on the upper surface of an insulating substrate. An amorphous silicon thin film is formed on the gate electrode and the gate-insulating film. The amorphous silicon thin film is polycrystallized, thereby forming a polysilicon thin film. The polysilicon thin film can be hydrogenated at the same time a passivation film (insulating film) is deposited on the polysilicon thin film by use of a plasma CVD method.

In all of the above-described embodiments, the "insulating body" on which the thin film 6 is formed may be the insulating substrate 1 alone as shown in FIGS. 1–8, or may be the combination off an insulating substrate 1 and an intermediate insulating base layer 1a formed on the insulating substrate 1 as shown in FIG. 9.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a thin-film transistor, comprising the steps of:
   providing an insulating body;
   depositing an amorphous silicon hydride thin film on one side of said insulating body by a plasma CVD method;
   heating said amorphous silicon hydride thin film to dehydrogenate said amorphous silicon hydride thin film, thereby forming a dehydrogenated amorphous silicon thin film; and
   applying excimer laser beams to said dehydrogenated amorphous silicon thin film, thereby polycrystallizing said dehydrogenated amorphous silicon thin film into a polysilicon thin film.

2. A method according to claim 1, further comprising the step of injecting impurity ions into said amorphous silicon hydride thin film to form source and drain regions, before the step of heating said amorphous silicon hydride thin film.

3. A method according to claim 2, wherein said dehydrogenated amorphous silicon thin film is polycrystallized and the impurity ions are activated at the same time in the step of applying excimer laser beams to said dehydrogenated amorphous silicon thin film.

4. A method according to claim 1, wherein the hydrogen content of said dehydrogenated amorphous silicon thin film immediately before the step of applying the excimer laser beams is no greater than 3 atomic %.

5. A method of manufacturing a thin-film transistor, comprising the steps of:
   providing an insulating body;
   depositing an amorphous silicon hydride thin film on one side of said insulating body by a plasma CVD method;
   heating said amorphous silicon hydride thin film to dehydrogenate said amorphous silicon hydride thin film, thereby forming a dehydrogenated amorphous silicon thin film;
   applying excimer laser beams to said dehydrogenated amorphous silicon thin film, thereby polycrystallizing said dehydrogenated amorphous silicon thin film into a polysilicon thin film; and
   depositing an insulating film on said polysilicon thin film by a plasma CVD method, and at the same time hydrogenating said polysilicon thin film to decrease dangling bonds.

6. A method according to claim 5, further comprising the step of injecting impurity ions into said amorphous silicon hydride thin film to form source and drain regions, before the step of heating said amorphous silicon hydride thin film.

7. A method according to claim 6, wherein said amorphous silicon thin film is polycrystallized and the impurity ions are activated at the same time in the step of applying excimer laser beams to said dehydrogenated amorphous silicon thin film.

8. A method according to claim 5, further comprising the step of forming a gate electrode on said insulating film formed on said polysilicon thin film.

9. A method according to claim 5, wherein the hydrogen content of said dehydrogenated amorphous silicon thin film immediately before the step of applying the excimer laser beams is no greater than 3 atomic %.

10. A method of manufacturing a thin-film transistor, comprising the steps of:
providing a plurality of insulating bodies;
depositing amorphous silicon hydride thin films on one side of the respective plurality of insulating bodies by a plasma CVD method;
heating said amorphous silicon hydride thin films to substantially dehydrogenate said amorphous silicon hydride films on all of said insulating bodies simultaneously, thereby forming substantially dehydrogenated amorphous silicon thin films containing hydrogen of not more than 3 atomic %;
injecting impurity ions into said dehydrogenated amorphous silicon hydride thin films to form source and drain regions; and
applying excimer laser beams to said amorphous silicon thin films, thereby polycrystallizing said amorphous silicon thin film into a polysilicon thin film.

11. A method according to claim 10, wherein said dehydrogenated amorphous silicon thin film is polycrystallized and the impurity ions are activated at the same time in the step of applying excimer laser beams to said dehydrogenated amorphous silicon thin film.

12. A method according to claim 1, wherein said heating step comprises heating said insulating body with said amorphous silicon hydride thin film thereon, in an inert gas.

13. A method according to claim 5, wherein said heating step comprises heating said insulating body with said amorphous silicon hydride thin film thereon, in an inert gas.

14. A method according to claim 10, wherein said heating step comprises heating said insulating bodies with said amorphous silicon hydride thin films thereon, in an inert gas.

15. A method according to claim 1, wherein said insulating body comprises an insulating substrate.

16. A method according to claim 1, wherein said insulating body comprises an insulating substrate and an intermediate insulating base layer on said substrate and interposed between said insulating substrate and said polysilicon thin film.

17. A method according to claim 5, wherein said step of providing an insulating body comprises providing an insulating substrate, and wherein said amorphous silicon hydride thin film is deposited directly on one side of said insulating substrate.

18. A method according to claim 5, wherein said step of providing an insulating body comprises providing an insulating substrate and an insulating intermediate base layer thereon, and wherein said step of depositing said amorphous silicon hydride thin film comprises depositing said amorphous silicon hydride thin film on one side of said intermediate insulating base layer.

19. A method according to claim 10, wherein said step of providing a plurality of insulating bodies comprises providing a respective plurality of insulating substrates, and wherein said amorphous silicon hydride thin films are respectively deposited directly on one side of said insulating substrates.

20. A method according to claim 10, wherein said step of providing a plurality of insulating bodies comprises providing aa respective plurality of insulating substrates and respective insulating intermediate base layers thereon, and wherein said step of depositing said amorphous silicon hydride thin films comprises depositing said amorphous silicon hydride thin films on one side of respective intermediate insulating base layers of said insulating bodies.

* * * * *